(12) United States Patent
Wang et al.

(10) Patent No.: US 12,721,028 B2
(45) Date of Patent: Aug. 25, 2026

(54) DISPLAY SUBSTRATE, DISPLAY PANEL AND MANUFACTURING METHOD THEREOF

(71) Applicants: Chengdu BOE Optoelectronics Technology Co., Ltd., Sichuan (CN); BOE TECHNOLOGY GROUP CO., LTD., Beijing (CN)

(72) Inventors: Tianfu Wang, Beijing (CN); Yang Shu, Beijing (CN)

(73) Assignees: Chengdu BOE Optoelectronics Technology Co., Ltd., Chengdu (CN); BOE TECHNOLOGY GROUP CO., LTD., Beijing (CN)

( * ) Notice: Subject to any disclaimer, the term of this patent is extended or adjusted under 35 U.S.C. 154(b) by 640 days.

(21) Appl. No.: 17/912,329

(22) PCT Filed: Oct. 26, 2021

(86) PCT No.: PCT/CN2021/126240
§ 371 (c)(1),
(2) Date: Sep. 16, 2022

(87) PCT Pub. No.: WO2022/188422
PCT Pub. Date: Sep. 15, 2022

(65) Prior Publication Data

US 2023/0125641 A1 Apr. 27, 2023

(30) Foreign Application Priority Data

Mar. 10, 2021 (CN) ......................... 202110260440.0

(51) Int. Cl.
*H10K 77/10* (2023.01)
*H10K 50/84* (2023.01)
(Continued)

(52) U.S. Cl.
CPC ........... *H10K 77/10* (2023.02); *H10K 50/841* (2023.02); *H10K 50/86* (2023.02); *H10K 59/65* (2023.02); *H10K 71/00* (2023.02)

(58) Field of Classification Search
CPC ...... H10K 77/10; H10K 50/841; H10K 50/86; H10K 59/65; H10K 71/00; H10K 59/873;
(Continued)

(56) References Cited

U.S. PATENT DOCUMENTS

2020/0321561 A1 10/2020 Park et al.
2021/0032156 A1* 2/2021 Hwang ............... H04M 1/0264
(Continued)

FOREIGN PATENT DOCUMENTS

CN 109031756 A 12/2018
CN 110149470 A * 8/2019 .......... H04M 1/0264
(Continued)

OTHER PUBLICATIONS

Booth, ("Recent applications of pulsed lasers in advanced materials processing," Thin Solid Films, vols. 453-454, 2004) (Year: 2004).*
(Continued)

*Primary Examiner* — Steven B Gauthier
*Assistant Examiner* — Alvin L Lee
(74) *Attorney, Agent, or Firm* — HOUTTEMAN LAW LLC

(57) ABSTRACT

An embodiment of the present disclosure provides a display substrate, including: a substrate has a through hole configured to mount a camera therein; and an adhesive layer on a display side of the substrate and provided therein with a first through hole. An aperture size of each of orthographic projections of the first through hole and the through hole on the substrate has a tolerance less than 0.30 mm. An embodiment of the present disclosure further provides a display panel, including: a substrate has a through hole; an adhesive
(Continued)

layer on a display side of the substrate and provided therein with a first through hole; an anti-reflection layer on the display side of the substrate and on a side of the adhesive layer proximal to the substrate, and provided therein with a second through hole; and a cover plate on a side of the adhesive layer away from the substrate.

8 Claims, 5 Drawing Sheets

(51) Int. Cl.

| | |
|---|---|
| ***H10K 50/86*** | (2023.01) |
| ***H10K 59/65*** | (2023.01) |
| ***H10K 71/00*** | (2023.01) |

(58) Field of Classification Search

CPC .... H10K 59/8791; H10K 71/80; H10K 59/10; G02B 1/11

See application file for complete search history.

(56) References Cited

U.S. PATENT DOCUMENTS

2021/0249484 A1* 8/2021 Yug ...................... H10K 77/111
2022/0059796 A1* 2/2022 Kim ...................... B32B 27/281

FOREIGN PATENT DOCUMENTS

CN 110335890 A * 10/2019 ........... H01L 27/322
CN 110716335 A 1/2020
CN 210836877 U 6/2020
CN 113035928 A 6/2021
WO WO-2015068926 A1 * 5/2015 ............. H10K 50/84

OTHER PUBLICATIONS

3M Brochure ("3M contrast enhancement film brochure," https://multimedia.3m.com/mws/media/1775350O/3m-contrast-enhancement-film-cef28xx-8148-x-series.pdf, 2018) (Year: 2018).*

* cited by examiner

DISPLAY SUBSTRATE, DISPLAY PANEL AND MANUFACTURING METHOD THEREOF

TECHNICAL FIELD

Embodiments of the present disclosure belong to the field of display technology, and in particular, to a display substrate, a display panel and a manufacturing method thereof.

BACKGROUND

As a design of extremely-narrow bezels of an Organic Light-Emitting Diode (OLED) display screen becomes more and more popular, a demand for narrowing a frame of a through hole (an AA Hole, that is, a hole in a display region of the display screen with a camera installed in the hole to implement an in-screen camera) on the OLED display screen appears on the market. In the present design, an adhesive layer provided with a hole is adopted in a process for attaching a packaging cover plate of the OLED display screen, with the hole of the adhesive layer corresponding to the through hole on the display screen, so that the camera can easily shoot through the corresponding hole. However, in such case, a fitting tolerance and a dimensional tolerance of the adhesive layer may adversely affect a design of a narrow frame of the through hole.

SUMMARY

The embodiments of the present disclosure provide a display substrate, a display panel and a manufacturing method thereof.

In a first aspect, an embodiment of the present disclosure provides a display substrate, including: a substrate provided therein with a through hole configured to mount a camera therein; and an adhesive layer on a display side of the substrate and provided therein with a first through hole. An aperture size of each of orthographic projections of the first through hole and the through hole on the substrate has a tolerance less than 0.30 mm.

In some embodiments, the display substrate further includes an anti-reflection layer between the substrate and the adhesive layer. The anti-reflection layer has a second through hole formed therein, and an aperture size of each of orthographic projections of the second through hole and the first through hole on the substrate has a tolerance less than 0.30 mm.

In some embodiments, the display substrate further includes a protective film disposed on a side of the adhesive layer away from the substrate and provided therein with a third through hole, with an aperture size of each of orthographic projections of the third through hole and the first through hole on the substrate having a tolerance less than 0.30 mm; and an orthographic projection of the protective film on the substrate overlaps the adhesive layer.

In some embodiments, an aperture size of each of the orthographic projections of any two of the through hole, the first through hole, the second through hole, and the third through hole on the substrate has a tolerance less than 0.25 mm.

In some embodiments, the orthographic projections of the through hole, the first through hole, the second through hole and the third through hole on the substrate overlap one another.

In some embodiments, an orthographic projection of the adhesive layer on the substrate includes at least one corner having an arc-shaped edge.

In some embodiments, the substrate includes a display region; a peripheral region located on at least one side of the display region; and a bonding region, which is disposed on a side of the peripheral region away from the display region and is capable of being bent to a back side of the substrate; and edges of the anti-reflection layer, the adhesive layer, and the protective film on a same side of the anti-reflection layer, the adhesive layer, and the protective film on one side are aligned with a neighboring edge between the display region and the peripheral region.

In some embodiments, the substrate includes a display region; a peripheral region located on at least one side of the display region; and a bonding region, which is disposed on a side of the peripheral region away from the display region and is capable of being bent to a back side of the substrate; and edges of the anti-reflection layer, the adhesive layer, and the protective film on a same side of the anti-reflection layer, the adhesive layer, and the protective film are aligned with one another, and orthographic projections of the aligned edges on the substrate are located between a neighboring edge between the display region and the peripheral region and a neighboring edge between the peripheral region and the bonding region.

In some embodiments, an area of a region of an orthographic projection of the anti-reflection layer on the substrate is larger than an area of a region of the orthographic projection of the protective film on the substrate; and the area of the region of the orthographic projection of the protective film on the substrate is larger than an area of a region of an orthographic projection of the adhesive layer on the substrate; and the orthographic projection of the anti-reflection layer on the substrate overlaps the display region.

In a second aspect, an embodiment of the present disclosure further provides a display panel, including: a substrate provided therein with a through hole; an adhesive layer disposed on a display side of the substrate and provided therein with a first through hole; an anti-reflection layer disposed on the display side of the substrate and located on a side of the adhesive layer proximal to the substrate, and provided therein with a second through hole; and a cover plate located on a side of the adhesive layer away from the substrate. An aperture size of each of orthographic projections of the through hole, the first through hole and the second through hole on the substrate has a tolerance less than 0.30 mm.

In some embodiments, the display panel further includes a light shielding layer disposed on the cover plate and located on a side of the cover plate facing the adhesive layer; and an orthographic projection of the light shielding layer on the substrate surrounds the through hole and overlaps an edge of the through hole.

In a third aspect, an embodiment of the present disclosure further provides a method for manufacturing the above display panel, including: forming the substrate; forming the anti-reflection layer and the adhesive layer on the display side of the substrate; performing a single perforating process on the substrate, the anti-reflection layer and the adhesive layer to simultaneously form the first through hole in the adhesive layer, the second through hole in the anti-reflection layer and the through hole in the substrate by a single process; and forming the cover plate on a side of the adhesive layer away from the substrate.

In some embodiments, before forming the cover plate on the side of the adhesive layer away from the substrate, the manufacturing method further includes: stripping off a protective film formed on a side of the adhesive layer away from the anti-reflection layer; and after forming the cover plate on the side of the adhesive layer away from the substrate, the manufacturing method further includes: curing the adhesive layer through an ultraviolet irradiation process.

BRIEF DESCRIPTION OF DRAWINGS

The accompanying drawings are used to provide a further understanding of the present disclosure, and constitute a part of the specification. The drawings are used to explain the present disclosure in conjunction with the embodiments of the present disclosure, but do not constitute any limitation to the present disclosure. The above and other features and advantages will become more apparent to those of ordinary skill in the art through the description of specific exemplary embodiments with reference to the drawings. In the drawings.

DETAIL DESCRIPTION OF EMBODIMENTS

Figure 1:
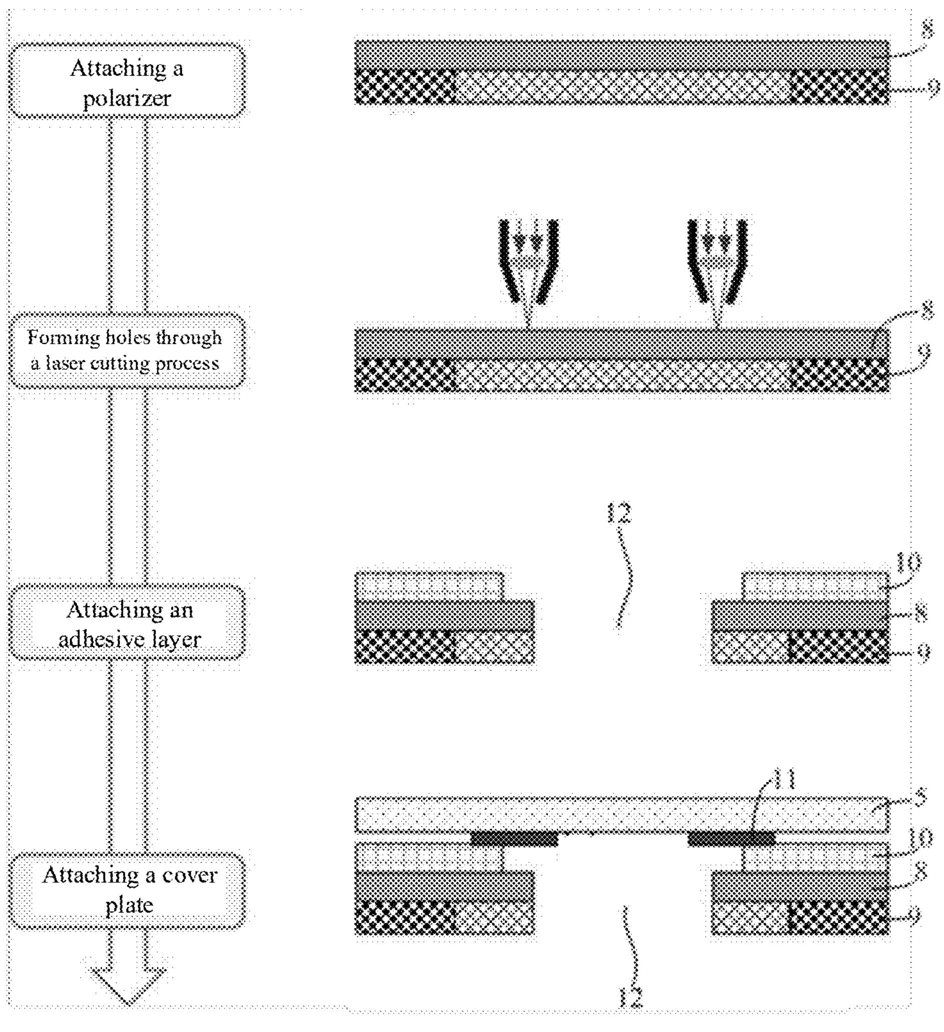
FIG. 1 is a schematic diagram showing a manufacturing process of an OLED display screen provided with a camera mounting hole in the prior art.

In order to enable those of ordinary skill in the art to better understand the technical solutions of the embodiments of the present disclosure, a display substrate, a display panel and a manufacturing method thereof provided by the embodiments of the present disclosure are further described in detail below with reference to the drawings and specific implementations.

The embodiments of the present disclosure will be described more fully below with reference to the drawings, but the embodiments illustrated herein may be embodied in different forms and should not be interpreted as being limited to the embodiments described herein. Rather, the embodiments are provided to make the present disclosure thorough and complete, so that those of ordinary skill in the art can fully understand the scope of the present disclosure.

The embodiments of the present disclosure are not limited to those illustrated by the drawings, but include modifications to configuration formed based on a manufacturing process. Thus, the regions shown in the drawings are illustrative, and the shapes of the regions shown in the drawings show specific shapes of the regions, but are not intended to make limitations.

With reference to FIG. 1, a process for manufacturing an OLED display screen provided with a camera mounting hole in the prior art includes: first of all, attaching a polarizer 8 on a display side of an OLED display substrate 9; forming, through a laser cutting process, a single hole penetrating through both of the polarizer 8 and the OLED display substrate 9; forming an adhesive layer 10 provided with a hole on a side of the polarizer 8 away from the OLED display substrate 9, with a position of the hole in the adhesive layer 10 corresponding to positions of the holes in the polarizer 8 and the OLED display substrate 9; and finally attaching a packaging cover plate 5 on a side of the adhesive layer 10 away from the OLED display substrate 9, with a pattern of ink layer 11 formed on the packaging cover plate 5 correspondingly covering an edge of the hole 12 in the adhesive layer 10, an edge of the hole in the polarizer 8 and an edge of the hole in the OLED display substrate 9. A camera is installed in the holes 12 in the adhesive layer 10, the polarizer 8 and the OLED display substrate 9, and the pattern of ink layer 11 may prevent light from leaking from the edges of the holes 12.

There are five main factors that affect narrowing of a frame of the camera mounting hole in the above technical solution: a tolerance for the laser cutting process, a dimensional tolerance of the hole in the adhesive layer, an alignment tolerance generated when attaching the adhesive layer, an alignment tolerance of the pattern of the ink layer on the packaging cover plate, and a fitting tolerance of the packaging cover plate. Since the hole in the adhesive layer is formed in advance in the prior art, both the dimensional tolerance of the hole in the adhesive layer and the alignment tolerance of the adhesive layer may be unfavorable for a design of a narrow frame of the camera mounting hole in an attaching process of the adhesive layer.

Figure 2:
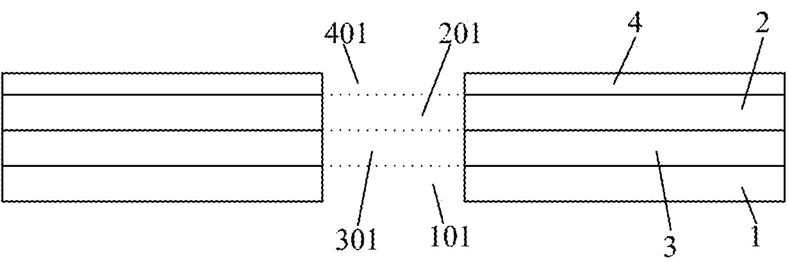
FIG. 2 is a sectional view showing a structure of a display substrate according to an embodiment of the present disclosure.

In view of the above problem that forming the hole in the adhesive layer in advance is unfavorable for the design of the narrow frame of the camera mounting hole, an embodiment of the present disclosure provides a display substrate, with reference to FIG. 2, including: a substrate 1 provided therein with a through hole 101 configured to mount a camera therein; and an adhesive layer 2 disposed on a display side of the substrate 1 and provided therein with a first through hole 201; and an aperture size of each of an orthographic projection of the first through hole 201 on the substrate 1 and an orthographic projection of the through hole 101 on the substrate 1 has a tolerance less than 0.30 mm.

The substrate 1 may be an Organic Light-Emitting Diode (OLED) display substrate, for example, the OLED display substrate includes a base substrate, a pixel circuit disposed on the base substrate, and an OLED light-emitting unit disposed on the pixel circuit. The OLED light-emitting unit includes an anode, a light-emitting functional layer and a cathode, which are stacked in sequence. A plurality of OLED light-emitting units are provided and are arranged in an array, and adjacent OLED light-emitting units are defined by a pixel defining layer and separated from each other. A plurality of pixel circuits are provided, and are electrically connected to the plurality of OLED light-emitting units in a one-to-one correspondence way for driving the OLED light-emitting units to emit light. The anode of each of the OLED light-emitting units is electrically connected to a corresponding pixel circuit. The OLED display substrate may further include a packaging layer for packaging the OLED light-emitting units, and the packaging layer may be a stacked layer of an inorganic film and an organic film.

In some embodiments, no pixel circuits and no OLED light-emitting units are disposed in the region of the substrate 1 where the through hole 101 is formed, and all film layers in the region of the substrate 1 where the through hole 101 is formed may be completely penetrated through to form the through hole for mounting the camera therein. The adhesive layer 2 is an adhesive film layer for subsequently adhering other film layers (e.g., a cover plate) on the display side of the substrate 1.

In the embodiment, after the adhesive layer 2 is disposed on the display side of the substrate 1, and a single hole is formed in the substrate 1 through the laser cutting process, that is, the first through hole 201 in the adhesive layer 2 and the through hole 101 in the substrate 1 are formed simultaneously, so that the aperture of each of the orthographic projection of the first through hole 201 on the substrate 1 and the orthographic projection of the through hole 101 on the substrate 1 may have a tolerance less than 0.30 mm; in this way, the problem in the prior art that the dimensional tolerance of the hole in the adhesive layer and the alignment tolerance of the adhesive layer caused by forming the hole in the adhesive layer in advance and then attaching the adhesive layer to the OLED display substrate are unfavorable for the design of the narrow frame of the camera mounting hole can be avoided, and an influence of a dimensional tolerance of the first through hole 201 in the adhesive layer 2 and an alignment tolerance of the adhesive layer 2 on a design of a narrow frame of the through hole 101 can be eliminated, thereby narrowing the frame of the through hole 101.

In some embodiments, the display substrate further includes an anti-reflection layer 3 located between the substrate 1 and the adhesive layer 2; and the anti-reflection layer 3 is provided therein with a second through hole 301, and an aperture size of each of an orthographic projection of the second through hole 301 on the substrate 1 and an orthographic projection of the first through hole 201 on the substrate 1 has a tolerance less than 0.30 mm. That is, in the embodiments, after the anti-reflection layer 3 is disposed on the display side of the substrate 1, a single through hole is formed in both of the anti-reflection layer 3 and the substrate 1 through a one-step laser cutting process, that is, the second through hole 301 in the anti-reflection layer 3, the first through hole 201 in the adhesive layer 2, and the through hole 101 in the substrate 1 are formed simultaneously, so that the aperture size of each of an orthographic projection of the second through hole 301 on the substrate 1 and an orthographic projection of the first through hole 201 on the substrate 1 may have a tolerance less than 0.30 mm. In this way, an influence of a dimensional tolerance of the second through hole 301 in the anti-reflection layer 3 and an alignment tolerance generated when attaching the anti-reflection layer 3 on the design of the narrow frame of the through hole 101 can be eliminated, thereby further narrowing the frame of the through hole 101.

In some embodiments, the anti-reflection layer 3 is a polarizer. A polarization direction of the light entering the substrate 1 through the polarizer is changed after the light is reflected by the film layers in the substrate 1, so that the light cannot exit out of the polarizer, thereby reducing or eliminating reflection of the light by the film layers in the substrate 1, and improving a display effect of the display substrate.

In some embodiments, the anti-reflection layer 3 is attached on the display side of the substrate 1.

In some embodiments, the display substrate further includes a protective film 4 disposed on a side of the adhesive layer 2 away from the substrate 1 and provided therein with a third through hole 401. An aperture size of each of an orthographic projection of the third through hole 401 on the substrate 1 and an orthographic projection of the first through hole 201 on the substrate 1 has a tolerance less than 0.30 mm. That is, in the embodiment, after the protective film 4 is disposed on the display side of the substrate 1, the protective film 4 is perforated together with the substrate 1, the anti-reflection layer 3 and the adhesive layer 2 through a single laser cutting process, that is, the third through hole 401 in the protective film 4, the first through hole 201 in the adhesive layer 2, the second through hole 301 in the anti-reflection layer 3, and the through hole 101 in the substrate 1 are formed simultaneously, so that the aperture size of each of the orthographic projection of the third through hole 401 on the substrate 1 and the orthographic projection of the first through hole 201 on the substrate 1 may have a tolerance less than 0.30 mm. In this way, an influence of a dimensional tolerance of the third through hole 401 in the protective film 4 and an alignment tolerance of the protective film 4 on the design of the narrow frame of the through hole 101 can be eliminated, thereby further narrowing the frame of the through hole 101.

In some embodiments, an aperture size of each of the orthographic projections of any two of the through hole 101, the first through hole 201, the second through hole 301, and the third through hole 401 on the substrate 1 has a tolerance less than 0.25 mm.

In some embodiments, with reference to FIG. 2, the orthographic projection of the through hole 101 on the substrate 1, the orthographic projection of the first through hole 201 on the substrate 1, the orthographic projection of the second through hole 301 on the substrate 1, and the orthographic projection of the third through hole 401 on the substrate 1 overlap one another.

In some embodiments, the protective film 4 is configured to protect a surface of the adhesive layer 2 away from the substrate 1 to prevent the adhesive layer 2 from being contaminated by the dust from the outside, so that an adhesion effect of the adhesive layer 2 on the other film layers (e.g., the cover plate) formed subsequently cannot be affected.

In some embodiments, the protective film 4 is a release film capable of being conveniently torn off when the adhesive layer 2 is attached to the other film layers formed subsequently.

In some embodiments, the protective film 4 may also be kept in the display substrate as a packaging film of the substrate 1, in this case the protective film 4 is made of a light-transmissive material.

In some embodiments, an orthographic projection of the protective film 4 on the substrate 1 covers the adhesive layer 2. That is, an area of a region of the orthographic projection of the protective film 4 on the substrate 1 is equal to or larger than that of the adhesive layer 2. Thus, the protective film 4 may cover the entire adhesive layer 2 to prevent the dust from the outside from contaminating the adhesive surface of the adhesive layer 2 away from the substrate 1, thereby ensuring good adhesion of the adhesive layer 2 to the film layers subsequently formed on the display side of the substrate 1.

Figure 3:
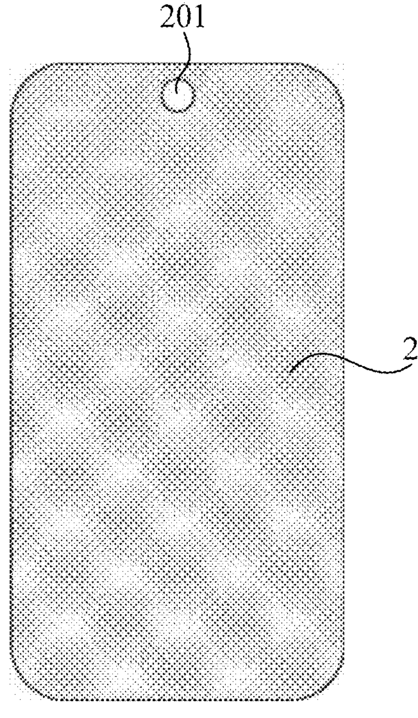
FIG. 3 is a top view showing a structure of an adhesive layer in a display substrate according to an embodiment of the present disclosure.
Figure 4:
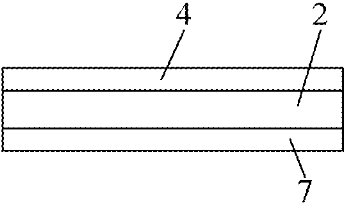
FIG. 4 is a sectional view showing a structure of an adhesive layer before the adhesive layer is attached to a display side of a substrate according to an embodiment of the present disclosure.
Figure 5:
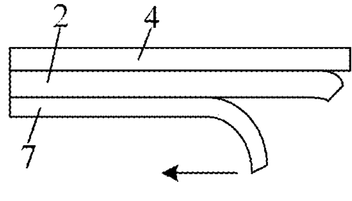
FIG. 5 is a sectional view showing a separation of a protective film on one adhesive surface of an adhesive layer from the adhesive layer at a corresponding position when a release film on the other adhesive surface of the adhesive layer is torn off, in case where the adhesive layer has four right angles.

In some embodiments, with reference to FIG. 3, an orthographic projection of the adhesive layer 2 on the substrate 1 includes at least one corner having an arc-shaped edge. That is, a shape of the orthographic projection of the adhesive layer 2 on the substrate 1 may be any shape including at least one corner, and the corner of the adhesive layer 2 is a rounded corner. The orthographic projection of the adhesive layer 2 on the substrate 1 is in a shape of rectangle, and each of the four corners of the rectangle is a rounded corner. With reference to FIG. 4 and FIG. 5, a release film 7 and the protective film 4 are respectively attached to two opposite adhesive surfaces of the adhesive layer 2 before the adhesive layer 2 is attached to the display side of the substrate 1; in a case where each of the four corners of the rectangular adhesive layer 2 is a right-angled corner, the release film 7 on one of the adhesive surfaces needs to be torn off from one corner of the release film 7 attached to the adhesive layer 2 before the adhesive layer 2 is attached to the display side of the substrate 1. Since an adhesive force between the adhesive layer 2 and the protective film 4 is equal to an adhesive force between the release film 7 and the adhesive layer 2, the adhesive layer 2 can be easily separated from the protective film 4 at a corresponding corner due to a tearing force generated when the release film 7 is torn off, resulting in bubbles between the adhesive layer 2 and the protective film 4, which affects protection of the protective film 4 on the other adhesive surface of the adhesive layer 2. With each of the four corners of the adhesive layer 2 being a rounded corner, a tear stress generated when the release film 7 is torn off can be dispersed, so that the separation of the adhesive layer 2 from the protective film 4 due to the tear stress can be avoided, and thus the formation of the bubbles between the adhesive layer 2 and the protective film 4 can be avoided, thereby ensuring good protection of the protective film 4 on the adhesive layer 2.

Figure 6:
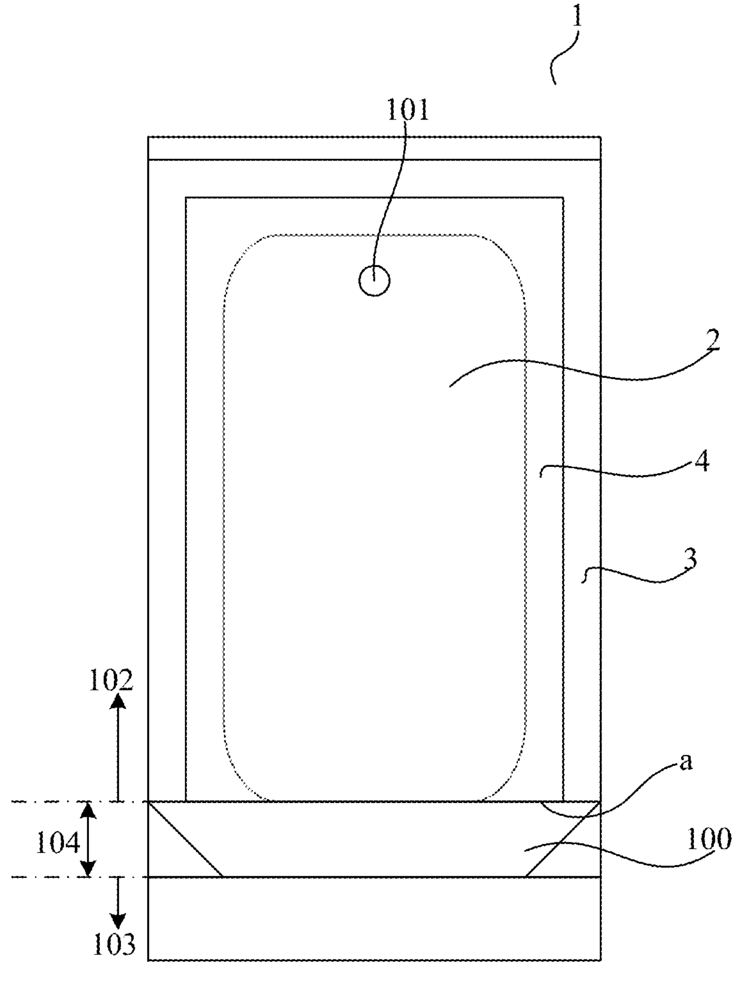
FIG. 6 is a top view showing a structure of a display substrate according to an embodiment of the present disclosure.

In some embodiments, with reference to FIG. 6, the substrate 1 includes a display region 102; a peripheral region 104 located on at least one side of the display region 102; and a bonding region 103 on a side of the peripheral region 104 away from the display region 102 and capable of being bent to a back side of the substrate 1. Edges on the same side of the anti-reflection layer 3, the adhesive layer 2, and the protective film 4 are aligned with a neighboring edge a between the display region 102 and the peripheral region 104. The peripheral region 104 is located on a side of the display region 102, and is provided with a pad region 100. A flexible printed circuit board is bonded in the bonding region 103, and the entire bonding region 103 is bent to the back side of the substrate 1 after the flexible printed circuit board is bonded in the bonding region 103. In the bending process, the flexible printed circuit board in the bonding region 103 is coated with an adhesive to prevent the flexible printed circuit board in the bonding region 103 from being broken when the bonding region 103 is bent to the back side of the substrate 1. If the anti-reflection layer 3, the adhesive layer 2 and the protective film 4 extend into the bonding region 103, the coating of the adhesive on the flexible printed circuit board in the bonding region 103 would be affected. Therefore, by aligning the edges on one side of the anti-reflection layer 3, the adhesive layer 2 and the protective film 4 with the neighboring edge a between the display region 102 and the peripheral region 104, the anti-reflection layer 3, the adhesive layer 2 and the protective film 4 can be prevented from extending into the bonding region 103, so as to prevent the anti-reflection layer 3, the adhesive layer 2 and the protective film 4 from interfering the coating process in the bonding region 103.

Figure 7:
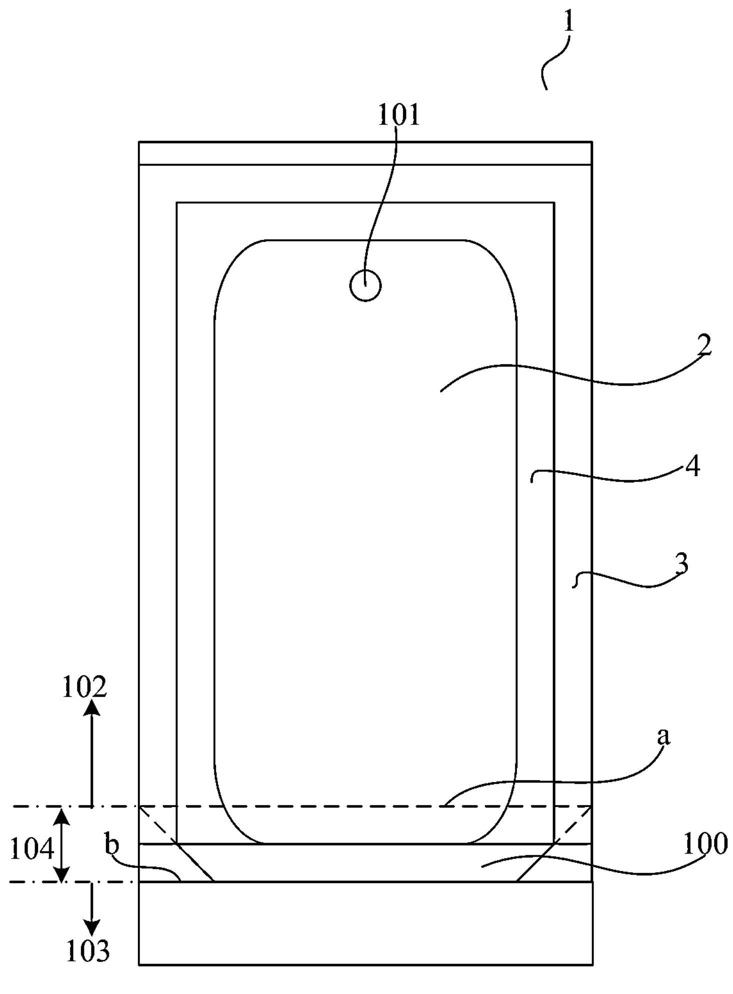
FIG. 7 is a top view showing another structure of a display substrate according to an embodiment of the present disclosure.

In some embodiments, with reference to FIG. 7, the edges on one side of the anti-reflection layer 3, the adhesive layer 2, and the protective film 4 are aligned with and overlap one another, and orthographic projections of the aligned edges on the substrate 1 are located between the neighboring edge a between the display region 102 and the peripheral region 104 and a neighboring edge b between the peripheral region 104 and the bonding region 103. In this way, the anti-reflection layer 3, the adhesive layer 2, and the protective film 4 can also be prevented from extending into the bonding region 103, so as to prevent the anti-reflection layer 3, the adhesive layer 2 and protective film 4 from interfering with the adhesive coating process in the bondingbinding region 103.

In some embodiments, with reference to FIG. 6 and FIG. 7, an area of a region of an orthographic projection of the anti-reflection layer 3 on the substrate 1 is larger than an area of a region of the orthographic projection of the protective film 4 on the substrate 1; and the area of the region of the orthographic projection of the protective film 4 on the substrate 1 is larger than an area of a region of the orthographic projection of the adhesive layer 2 on the substrate 1. The protective film 4 is torn off when the adhesive layer 2 is subsequently attached to the other film layers (e.g., the cover plate).

In some embodiments, the orthographic projection of the anti-reflection layer 3 on the substrate 1 covers the display region 102.

In some embodiments, the adhesive layer 2 is made of a transparent adhesive such as an Optically Clear Adhesive (OCA). The OCA may function as a good adhesive film layer, and may also perform a normal function for light transmission. The light transmittance of the OCA may be greater than 95%, so that normal display of the display substrate can be ensured.

In the display substrate in the embodiment of the present disclosure, after the adhesive layer is disposed on the display side of the substrate, the adhesive layer is perforated together with the substrate through a single laser cutting process, that is, the first through hole in the adhesive layer and the through hole in the substrate are formed simultaneously, so that the aperture of each of the orthographic projection of the first through hole on the substrate and the orthographic projection of the through hole on the substrate may have a tolerance less than 0.30 mm; in this way, the problem in the prior art that the dimensional tolerance of the hole in the adhesive layer and the alignment tolerance of the adhesive layer caused by forming the hole in the adhesive layer in advance and then attaching the adhesive layer to the OLED display substrate are unfavorable for the design of the narrow frame of the camera mounting hole can be avoided, and the influence of the dimensional tolerance of the first through hole in the adhesive layer and the alignment tolerance of the adhesive layer on the design of the narrow frame of the through hole can be eliminated, thereby narrowing the frame of the through hole.

Figure 8:
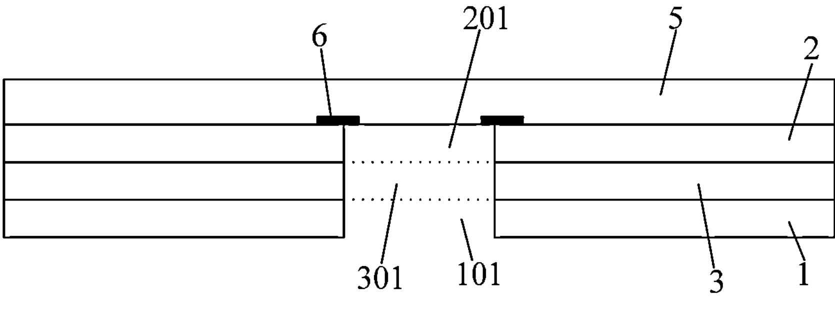
FIG. 8 is a sectional view showing a structure of a display panel according to an embodiment of the present disclosure.

An embodiment of the present disclosure further provides a display panel, with reference to FIG. 8, including: a substrate 1 provided therein with a through hole 101; an adhesive layer 2 disposed on a display side of the substrate 1 and provided therein with a first through hole 201; an anti-reflection layer 3 disposed on the display side of the substrate 1 and on a side of the adhesive layer 2 proximal to the substrate 1, and provided therein with a second through hole 301; and a cover plate 5 located on a side of the adhesive layer 2 away from the substrate 1; and an aperture size of each of an orthographic projection of the through hole 101 on the substrate 1, an orthographic projection of the first through hole 201 on the substrate 1, and an orthographic projection of the second through hole 301 on the substrate 1 has a tolerance less than 0.30 mm.

In some embodiments, an aperture of each of the orthographic projections of any two of the through hole 101, the first through hole 201 and the second through hole 301 on the substrate 1 has a tolerance less than 0.25 mm.

The display panel in the embodiment is formed by tearing off the protective film from the display substrate in above embodiment, and then attaching the cover plate 5 to a side of the adhesive layer 2 away from the substrate 1.

In the embodiment, after the anti-reflection layer 3 and the adhesive layer 2 are sequentially disposed on the display side of the substrate 1, the first through hole 201 in the adhesive layer 2, the second through hole 301 in the anti-reflection layer 3, and the through hole 101 in the substrate 1 are formed simultaneously through a single laser cutting process, so that the aperture size of each the orthographic projections of the first through hole 201, the second through hole 301 and the through hole 101 on the substrate 1 may have a tolerance less than 0.30 mm; in this way, the problem in the prior art that the dimensional tolerance of the hole in the adhesive layer and the alignment tolerance of the adhesive layer caused by forming the hole in the adhesive layer in advance and then attaching the adhesive layer to the OLED display substrate are unfavorable for the design of the narrow frame of the camera mounting hole can be avoided, and the influences of the dimensional tolerance of the first through hole 201 in the adhesive layer 2, the alignment tolerance of the adhesive layer 2, the dimensional tolerance of the second through hole 301 in the anti-reflection layer 3, and the alignment tolerance generated when attaching the anti-reflection layer 3 on the design of the narrow frame of the through hole 101 can be eliminated, thereby narrowing the frame of the through hole 101.

In some embodiments, with reference to FIG. 8, the orthographic projection of the through hole 101 on the substrate 1, the orthographic projection of the first through hole 201 on the substrate 1, the orthographic projection of the second through hole 301 on the substrate 1, and the orthographic projection of the third through hole 401 on the substrate 1 overlap one another.

In some embodiments, the display panel further includes a light shielding layer 6 disposed on the cover plate 5 and located on a side of the cover plate 5 facing the adhesive layer 2; and an orthographic projection of the light shielding layer 6 on the substrate 1 surrounds the through hole 101 and covers the edge of the through hole 101. That is, the orthographic projection of the light shielding layer 6 on the substrate 1 covers the edge of the first through hole 201 and the edge of the second through hole 301. The light shielding layer 6 serves as a frame of the through hole 101, the first through hole 201 and the second through hole 301, and a width of the frame may be decreased to a minimum width for the preparation process of the light shielding layer 6. The light shielding layer 6 may prevent the light from leaking out of the edges of the through hole 101, the first through hole 201 and the second through hole 301.

In some embodiments, the light shielding layer 6 is made of a black ink material.

In some embodiments, an orthographic projection of the cover plate 5 on the substrate 1 covers the orthographic projections of the anti-reflection layer 3 and the adhesive layer 2 on the substrate 1. The cover plate 5 may cover the entire surface of the substrate 1 on the display side of the substrate 1, thereby protecting the whole display side of the substrate 1 very well.

In some embodiments, the cover plate 5 is made of a glass material or a transparent resin material such as a polyimide (PI) film or a polyethylene terephthalate (PET) film. When the cover plate 5 is made of a hard material, the display panel is a non-flexible panel; and when the cover plate 5 is made of a flexible transparent resin material, the display panel may be a flexible panel capable of realizing flexible bending.

Figure 9:
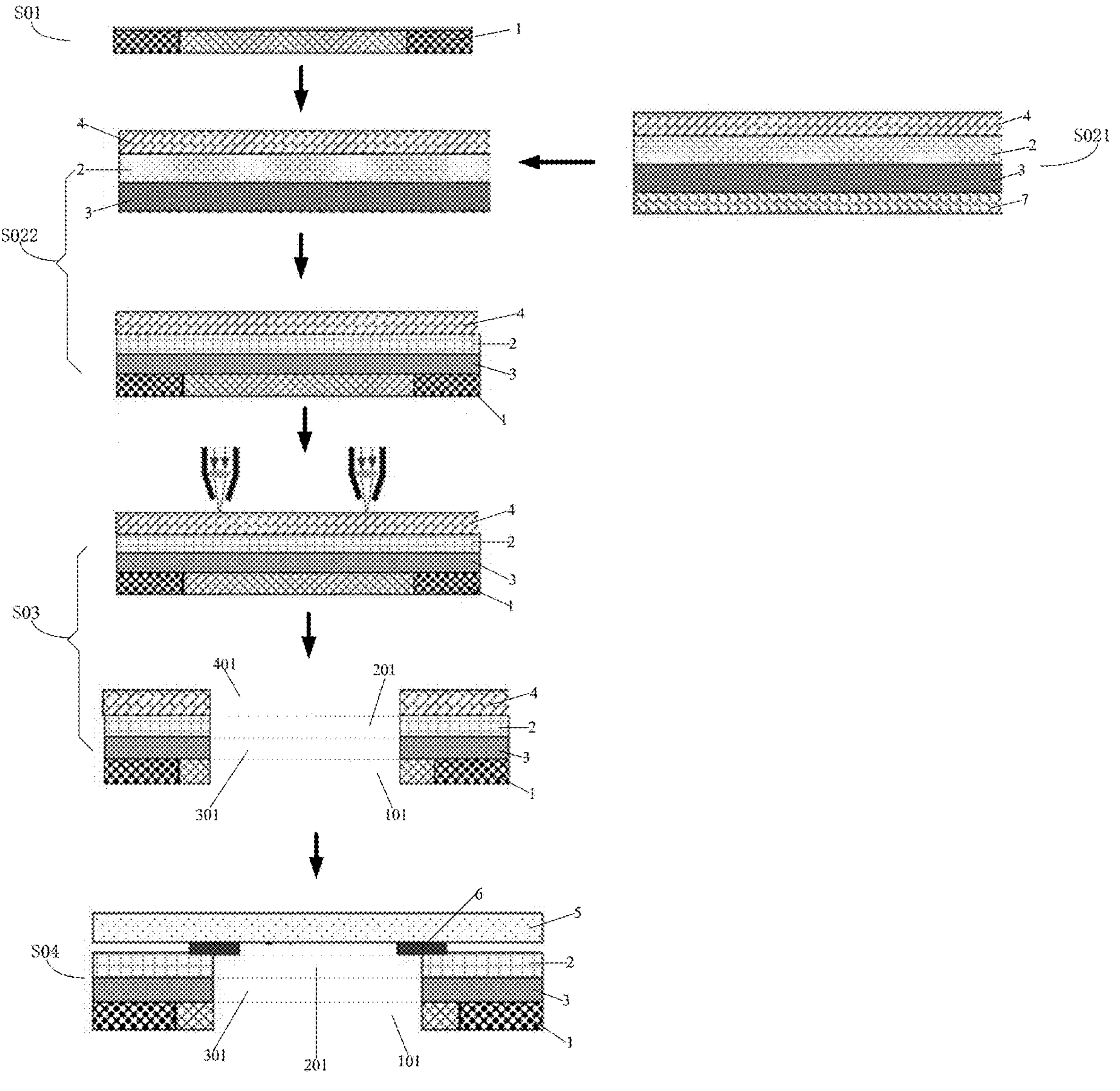
FIG. 9 is a schematic diagram showing a process for manufacturing a display panel according to an embodiment of the present disclosure.

Based on the above structure of the display panel, an embodiment of the present disclosure further provides a method for manufacturing the display panel, with reference to FIG. 9, including steps S01 to S04.

In step S01, the substrate 1 is formed.

In step S02, the anti-reflection layer 3 and the adhesive layer 2 are formed on the display side of the substrate 1.

In step S03, the substrate 1, the anti-reflection layer 3 and the adhesive layer 2 are perforated through a single perforating process to form the first through hole 201 in the adhesive layer 2, the second through hole 301 in the anti-reflection layer 3 and the through hole 101 in the substrate 1.

In step S04, the cover plate 5 is formed on a side of the adhesive layer 2 away from the substrate 1.

In some embodiments, with reference to FIG. 6, the substrate 1 includes the display region 102; the peripheral region 104 located on at least one side of the display region 102; and the bonding region 103, which is disposed on a side of the peripheral region 104 away from the display region 102 and is capable of being bent to the back side of the substrate 1. All of the edges on the same side of the anti-reflection layer 3, the adhesive layer 2, and the protective film 4 are aligned with the neighboring edge a between the display region 102 and the peripheral region 104.

The step S02 of forming the anti-reflection layer 3 and the adhesive layer 2 on the display side of the substrate 1 includes: steps S021 and S022. In step S021, the anti-reflection layer 3 and the adhesive layer 2 are sequentially formed on the release film 7, and the protective film 4 is formed on a side of the adhesive layer 2 away from the release film 7. In step S022, the release film 7 is removed, and the exposed surface of the anti-reflection layer 3 is attached to the surface of the substrate 1 on the display side of the substrate 1, such that each of the edges on the same side of the anti-reflection layer 3, the adhesive layer 2 and the protective film 4 is aligned with the neighboring edge between the display region 102 and the peripheral region 104.

By setting each of the four corners of the adhesive layer 2 to be a rounded corner in the step, the tear stress generated when the release film 7 is stripped off can be dispersed, so that the separation of the adhesive layer 2 from the protective film 4 due to the tear stress can be avoided, and thus the formation of the bubbles between the adhesive layer 2 and the protective film 4 can be avoided, thereby ensuring that the protective film 4 forms the good protection for the adhesive layer 2.

By making the edges on the same side of the anti-reflection layer 3, the adhesive layer 2, and the protective film 4 be aligned with the neighboring edge between the display region 102 and the peripheral region 104 in the step, the anti-reflection layer 3, the adhesive layer 2 and the protective film 4 may be prevented from extending into the bonding region 103, so as to prevent the anti-reflection layer 3, the adhesive layer 2 and the protective film 4 from interfering with the adhesive coating process of bonding area 103.

In some embodiments, the step S03 further includes performing a single perforating process on all of the protective film 4, the substrate 1, the anti-reflection layer 3 and the adhesive layer 2 to form the first through hole 201 in the adhesive layer 2, the second through hole 301 in the anti-reflection layer 3 and the through hole 101 in the substrate 1, synchronized with the formation of the third through hole 401 in the protective film 4. The orthographic projection of the third through hole 401 on the substrate 1 overlaps the orthographic projection of the first through hole 201 on the substrate 1.

In some embodiments, before the step S04 of forming the cover plate 5 on the side of the adhesive layer 2 away from the substrate 1, the manufacturing method further includes: stripping off the protective film formed on a side of the adhesive layer 2 away from the anti-reflection layer 3; and after the step S04, the manufacturing method further includes: curing the adhesive layer 2 through an ultraviolet irradiation process. The ultraviolet irradiation process may cure the adhesive layer 2, so as to firmly bond the cover plate 5 and the substrate 1 together.

In some embodiments, the light shielding layer 6 is formed on the cover plate 5 in advance through a printing process or a coating process, and the cover plate 5 with the light shielding layer 6 formed thereon is attached and bonded to the substrate 1 by curing the adhesive layer 2 through the ultraviolet irradiation process.

In the display panel in the embodiments of the present disclosure, after the adhesive layer and the anti-reflection layer are disposed on the display side of the substrate, the adhesive layer, the anti-reflection layer, and the substrate are perforated together through a single laser cutting process, that is, the first through hole in the adhesive layer, the second through hole in the anti-reflection layer and the through hole in the substrate are formed simultaneously, so that the aperture size of each of the orthographic projection of the first through hole on the substrate, the orthographic projection of the second through hole on the substrate, and the orthographic projection of the through hole on the substrate may have a tolerance less than 0.30 mm; in this way, the problem in the prior art that the dimensional tolerance of the hole in the adhesive layer and the alignment tolerance generated when attaching the adhesive layer caused by forming the hole in the adhesive layer in advance and then attaching the adhesive layer to the OLED display substrate are unfavorable for the design of the narrow frame of the camera mounting hole can be avoided, and the influence of the dimensional tolerance of the first through hole in the adhesive layer and the alignment tolerance generated when attaching the adhesive layer on the design of the narrow frame of the through hole can be eliminated, thereby further narrowing the frame of the through hole.

The display panel in the embodiments of the present disclosure may be any product or component with a display function, such as an OLED panel, an OLED TV, a monitor, a mobile phone, or a navigator.

It should be understood that the above embodiments are merely exemplary embodiments adopted to illustrate the principle of the present disclosure, and the present disclosure is not limited thereto. Various modifications and improvements can be made by those of ordinary sill in the art without departing from the spirit and essence of the present disclosure, and these modifications and improvements are considered to fall within the scope of the present disclosure.

What is claimed is:

1. A method for manufacturing a display panel, comprising:

forming a substrate;

forming an anti-reflection layer and an adhesive layer on a display side of the substrate;

performing a single perforating process on the substrate, the anti-reflection layer and the adhesive layer to simultaneously form a first through hole in the adhesive layer, a second through hole in the anti-reflection layer and a through hole in the substrate; and forming a cover plate on a side of the adhesive layer away from the substrate, wherein forming the anti-reflection layer and the adhesive layer on the display side of the substrate, comprises:

providing a release film;

sequentially forming the anti-reflection layer and the adhesive layer on the release film, wherein an orthographic projection of the adhesive layer on the substrate is rectangular with each of four corners of the rectangular orthographic projection being a rounded corner;

forming a protective film on a side of the adhesive layer away from the anti-reflection layer;

removing the release film, and attaching an exposed surface of the anti-reflection layer to a surface on the display side of the substrate;

before forming the cover plate on the side of the adhesive layer away from the substrate, the method further comprises: stripping off the protective film on a side of the adhesive layer away from the anti-reflection layer;

after forming the cover plate on the side of the adhesive layer away from the substrate, the method further comprises: curing the adhesive layer through an ultraviolet irradiation process.

2. The method according to claim 1, wherein an aperture size of each of an orthographic projection, on the substrate, of the first through hole in the adhesive layer, the second through hole in the anti-reflection layer and the through hole in the substrate has a tolerance less than 0.30 mm.

3. The method according to claim 1, wherein an aperture size of each of the orthographic projections of any two of the through hole, the first through hole, and the second through hole on the substrate has a tolerance less than 0.25 mm.

4. The method according to claim 1, wherein the adhesive layer is made of a transparent adhesive.

5. The method according to claim 1, wherein an exposed surface of the anti-reflection layer is attached to a surface on the display side of the substrate, such that each of edges on the same side of the anti-reflection layer, the adhesive layer and the protective film is aligned with a neighboring edge between a display region and a peripheral region on at least one side of the display region of the substrate.

6. The method according to claim 1, wherein performing the single perforating process on the substrate, the anti-reflection layer and the adhesive layer to simultaneously form the first through hole in the adhesive layer, the second through hole in the anti-reflection layer and the through hole in the substrate further comprises:

forming a third through hole in the protective film simultaneously with the formation of the first through hole in the adhesive layer, the second through hole in the anti-reflection layer and the through hole in the substrate, such that an orthographic projection of the third through hole on the substrate overlaps an orthographic projection of the first through hole on the substrate.

7. The method according to claim 1, further comprising: forming a light shielding layer on the cover plate in advance through a printing process or a coating process.

8. The method according to claim 7, wherein the light shielding layer is made of a black ink material.

* * * * *